(12) United States Patent
Shimizu et al.

(10) Patent No.: US 7,907,589 B2
(45) Date of Patent: Mar. 15, 2011

(54) RECEPTION APPARATUS AND RECEPTION METHOD

(75) Inventors: Yoshito Shimizu, Yokohama (JP); Noriaki Saito, Machida (JP)

(73) Assignee: Panasonic Corporation, Osaka (JP)

( * ) Notice: Subject to any disclaimer, the term of this patent is extended or adjusted under 35 U.S.C. 154(b) by 1320 days.

(21) Appl. No.: 10/581,036

(22) PCT Filed: Nov. 30, 2004

(86) PCT No.: PCT/JP2004/017785
§ 371 (c)(1),
(2), (4) Date: May 30, 2006

(87) PCT Pub. No.: WO2005/055447
PCT Pub. Date: Jun. 16, 2005

(65) Prior Publication Data
US 2007/0082629 A1    Apr. 12, 2007

(30) Foreign Application Priority Data
Dec. 1, 2003  (JP) ................................. 2003-402232

(51) Int. Cl.
H04J 3/00 (2006.01)
H04B 1/04 (2006.01)
H04B 1/06 (2006.01)
H04L 27/08 (2006.01)

(52) U.S. Cl. .................. 370/345; 455/127.2; 455/232.1; 455/234.1; 455/234.2; 375/345

(58) Field of Classification Search .................. 370/345; 455/127.1, 127.2, 232.1, 234.1, 234.2; 375/345
See application file for complete search history.

(56) References Cited

U.S. PATENT DOCUMENTS

| 6,516,185 | B1 * | 2/2003 | MacNally ................... 455/234.1 |
| 6,667,965 | B1 | 12/2003 | Yamaura et al. |
| 6,826,388 | B1 | 11/2004 | Tanaka et al. |
| 2002/0016158 | A1 * | 2/2002 | Shibuya et al. ............ 455/232.1 |

(Continued)

FOREIGN PATENT DOCUMENTS

EP    1065786    1/2001
(Continued)

OTHER PUBLICATIONS

PCT International Search Report dated Mar. 22, 2005.
3GPP TS 05.02 V8.11.0 (Jun. 2003); 3rd Generation Partnership Project; Technical Specification Group GSM/EDGE Radio Access Network; Multiplexing and multiple access on the radio path (Release 1999), pp. 1-59.

(Continued)

*Primary Examiner* — Dwayne D Bost
*Assistant Examiner* — Timothy Pham
(74) *Attorney, Agent, or Firm* — Dickinson Wright PLLC

(57) ABSTRACT

A reception apparatus capable of preventing saturation and sensitivity degradation of a receiver when base transceiver station transmit power control is performed and calibrating offset voltage without increasing the amount of current consumption. In this apparatus, a gain setting section (109) estimates reception field intensity of each time slot in the next frame based on information of the reception field intensity and transmit power information which is information of the transmit power of the base transceiver station and calculates a gain set value according to the estimated reception field intensity. A gain control circuit (110) extracts a maximum gain out of the gains set by the gain setting section (109), uses the maximum gain as a set gain for DC offset voltage calibration and performs gain control at the gain set value corresponding to each time slot. A voltage calibration circuit (111) performs the DC offset voltage calibration of the received signal.

10 Claims, 11 Drawing Sheets

U.S. PATENT DOCUMENTS

| | | | |
|---|---|---|---|
| 2002/0160738 A1* | 10/2002 | Allott et al. | 455/304 |
| 2003/0031135 A1 | 2/2003 | Itoh | |
| 2004/0053586 A1* | 3/2004 | Simmons et al. | 455/130 |
| 2004/0081256 A1* | 4/2004 | Shi et al. | 375/317 |
| 2004/0100898 A1* | 5/2004 | Anim-Appiah et al. | 370/210 |
| 2004/0121746 A1* | 6/2004 | Akamine et al. | 455/130 |
| 2004/0137859 A1 | 7/2004 | Muto | |

FOREIGN PATENT DOCUMENTS

| | | |
|---|---|---|
| JP | 5327599 | 12/1993 |
| JP | 9116360 | 5/1997 |
| JP | 200040997 | 2/2000 |
| JP | 2001016638 | 1/2001 |
| JP | 2001160835 | 6/2001 |
| JP | 2001211098 | 8/2001 |
| JP | 2002185398 | 6/2002 |
| JP | 2003046424 | 2/2003 |

OTHER PUBLICATIONS

3GPP TS 05.08 V8.16.0 (Apr. 2003); 3rd Generation Partnership Project; Technical Specification Group GSM/EDGE Radio Access Network; Radio subsystem link control (Release 1999), pp. 1-96.

3GPP TS 05.05 V8.9.0 (Apr. 2001); 3rd Generation Partnership Project; Technical Specification Group GSM/EDGE Radio Access Network; Digital cellular telecommunications system (Phase 2+); Radio transmission and reception (Release 1999), pp. 1-94.

3GPP TS 04.60 V8.18.0 (Apr. 2003); 3rd Generation Partnership Project; Technical Specification Group GSM/EDGE Radio Access Network; General Packet Radio Service (GPRS); Mobile Station (MS)—Base Station System (BSS) interface; Radio Link Control/Medium Access Control (RLC/MAC) protocol (Release 1999), pp. 1-313.

* cited by examiner

| MULTI-SLOT CLASS | MAXIMUM NUMBER OF TIME SLOTS ALLOCATED | | |
|---|---|---|---|
| | RECEPTION | TRANSMISSION | TOTAL |
| 1 | 1 | 1 | 2 |
| 2 | 2 | 1 | 3 |
| 3 | 2 | 2 | 3 |
| 4 | 3 | 1 | 4 |
| 5 | 2 | 2 | 4 |
| 6 | 3 | 2 | 4 |
| 7 | 3 | 3 | 4 |
| 8 | 4 | 1 | 5 |
| 9 | 3 | 2 | 5 |
| 10 | 4 | 2 | 5 |
| 11 | 4 | 3 | 5 |
| 12 | 4 | 4 | 5 |

PRIOR ART
FIG.1

| TOTAL GAIN [dB] | GAIN OF VARIABLE GAIN AMPLIFIER 201 [dB] | GAIN OF VARIABLE GAIN AMPLIFIER 203 [dB] | GAIN OF VARIABLE GAIN AMPLIFIER 205 [dB] |
|---|---|---|---|
| 15 | 5 | 5 | 5 |
| 10 | 5 | 0 | 5 |
| 5 | 0 | 5 | 0 |
| 0 | 0 | 0 | 0 |

FIG.10

| TOTAL GAIN [dB] | GAIN OF VARIABLE GAIN AMPLIFIER 201 [dB] | GAIN OF VARIABLE GAIN AMPLIFIER 203 [dB] | GAIN OF VARIABLE GAIN AMPLIFIER 205 [dB] |
|---|---|---|---|
| 15 | 5 | 5 | 5 |
| 10 | 5 | 5 | 0 |
| 5 | 5 | 0 | 0 |
| 0 | 0 | 0 | 0 |

FIG.11

RECEPTION APPARATUS AND RECEPTION METHOD

TECHNICAL FIELD

The present invention relates to a reception apparatus and a reception method, and more particularly, to a reception apparatus and a reception method for use in a system where transmit power of transmission signals varies by downlink transmit power control.

BACKGROUND ART

In cellular phone services in recent years, in addition to voice calls, a demand for data communication is expanding with an increasing number of subscribers (mobile stations), and therefore it is important to efficiently use resources such as frequency channels and improve communication speed. For example, in a GSM (Global System for Mobile communications) system which is becoming popular mainly in Europe and Asian regions, services corresponding to high-speed communication called "GPRS" (General Packet Radio Service) have started. In GPRS, with respect to a link between mobile stations and a base transceiver station, instead of allocating dedicated frequency channels to a specific mobile station, the same frequency channel is shared by a plurality of mobile stations, and, when data to be transmitted to the other party exists in either the mobile station or base transceiver station, time slots are allocated to a specific mobile station every time. This scheme improves utilization efficiency of frequency channels.

Moreover, by using a multi-slot transmission scheme which allocates a plurality of time slots in a data frame (8 time slots) to the same mobile station, improvement of downlink speed from the base transceiver station to the mobile station is realized.

For example, FIG. 1 shows an allocation of time slots for a mobile station. Here, representative classes up to class 12 are excerpted and described from 29 multi-slot classes described in a GSM specification "digital cellular telecommunications system (Phase 2+); Multiplexing and Multiple Access on the Radio Path (3GPP TS 05.02 ver 8.11.0 Release 1999)."

FIG. 1 shows a maximum number of time slots that can be allocated to a downlink (reception), uplink (transmission) and a maximum number of time slots that can be allocated to the downlink and uplink together for a mobile station which corresponds to each multi-slot class. For example, it is possible to allocate a maximum of 5 slots to the downlink and uplink together, a maximum of 4 slots to the downlink and a maximum of 4 slots to the uplink within 1 frame for the mobile station of class 12.

Furthermore, the respective mobile stations share time slots allocated to multi-slot classes, demodulate all data in the time slots, and then decide whether the TFI (Temporary Flow Identifier) in header information of the data indicates the subject mobile station or not, and discard the data if the data is directed to other mobile stations. In this way, each mobile station receives time slots allocated to the multi-slot class. According to the GSM specification "Digital cellular telecommunications system (Phase 2+); General Packet Radio Service (GPRS); Mobile Station(MS)—Base Station System (BSS) interface; Radio LinkControl/Medium Access Control (RLC/MAC) protocol (3GPP TS 04.60 ver 8.18.0 Release 1999)," a TFI is described in 5 bits, and therefore one time slot can be shared by a maximum of 32 mobile stations.

Next, when the same frequency channel is shared by a plurality of mobile stations in a cell covered by a specific base transceiver station, the distance between the base transceiver station and each mobile station differs from one mobile station to another, and therefore it is necessary for the base transceiver station to carry out transmission to each mobile station with transmit power so that the farthest mobile station in the cell can receive data in predetermined quality. In this case, unnecessary power is radiated to the cell and interference with cells covered by adjacent base transceiver stations becomes a problem.

Therefore, an interference measures in GPRS will be explained using FIG. 2. FIG. 2 is a GSM network configuration.

In FIG. 2, a GSM network is configured with telephone network 11 of fixed-line phones, mobile services switching center (MSC) 12, base station controllers (BSC) 13, 14, 15, base transceiver stations (BTS) 16, 17, 18 and mobile stations (MS) 21, 22, 23, 24, 25 which exist in respective cells 19, 20 covered by base transceiver stations 17, 18.

The GSM system is provided with at least one mobile services switching center 12 and mobile services switching center 12 is connected to telephone network 11. A plurality of base station controllers 13, 14, 15 are provided below mobile services switching center 12 and at least one base transceiver station 16, 17, 18 is provided below base station controllers 13, 14, 15 and communication is carried out between the base transceiver stations. Furthermore, radio communication is carried out between base transceiver stations 17, 18 and mobile stations 21, 22, 23, 24, 25 in cells 19, 20 covered by the base transceiver station 17, 18. In FIG. 2, communication is possible, for example, between mobile station 22 in cell 19 and mobile station 24 in cell 20 or between mobile station 23 and telephone network 11. When transmission is performed to all the mobile stations with the same output power when the distances between mobile stations 21, 22, 23 in cell 19 and base transceiver station 17 differ from one another, transmit power is set based on the farthest mobile station, and therefore power which would be unnecessary under normal conditions is sent to the same frequency channels, which results in a problem of interference against adjacent cells. Thus, GPRS realizes downlink transmit power control (hereinafter, referred to as "power control") to corresponding mobile stations according to the distance between base transceiver station 17 and mobile stations 21, 22, 23. Specific examples of power control include a method of reporting a decrement value (0 to 30 dB) of transmit power from a broadcast channel (BCCH: Broadcast Control CHannel) to a mobile station using a P0 parameter in a resource allocation message of the downlink which is transmitted on a control channel. BCCH is an important channel which all mobile stations existing in the cell should refer to and is transmitted with a sufficient transmission level (POWbcch: a fixed value) that even the mobile station at the maximum distance from the base transceiver station can reproduce data reliably.

In a system which supports multi-slot transmission and carries out power control, if data transmission of higher priority to another mobile station interrupts, or a control message such as recognition message for uplink data transmission for another mobile station interrupts multi-slot transmission to a specific mobile station, the received signal strength indicator (RSSI) with which the specific mobile station receives data fluctuates significantly. For this reason, to prevent the mobile station from saturating or to maintain the reception quality to a predetermined value, it is necessary to perform gain switching between adjacent time slots at high speed.

However, with a direct conversion reception apparatus which is a mainstream as a reception section configuration of the mobile station at present, DC offset voltage (hereinafter, referred to as "offset voltage") is produced due to gain switching in accordance with RSSI fluctuation and there is a possibility that a reception apparatus may be saturated, and therefore it is necessary to perform gain switching immediately before receiving demodulated data and then calibrate the offset voltage at high speed (for example, see Patent Document 1.)

FIG. 3 is a block diagram of conventional offset voltage calibration circuit 30. In FIG. 3, offset voltage calibration circuit 30 is configured with low noise amplifier 31, quadrature demodulator 32 that converts the frequency of a radio frequency to a baseband, 90-degree phase shifter 33 that outputs 2 signals having a phase difference of 90 degrees for quadrature demodulator 32, analog baseband circuit 34 made up of variable gain amplifiers and low pass filters, voltage calibration circuit 35 that calibrates offset voltage of analog baseband circuit 34 and digital signal processing section 36 that converts the signal received from analog baseband circuit 34 to a voice signal or data signal and transmits a calibration start signal to voltage calibration circuit 35 via a decoder. Voltage calibration circuit 35 executes calibration operation for a certain period using a calibration start signal as a trigger immediately before the frame and pauses during the frame. Furthermore, in the calibrating period, voltage calibration circuit 35 separates a capacitor from the signal line to improve the calibration response speed.

Furthermore, as a gain setting method for the reception apparatus in multi-slot transmission, there is a method whereby demodulation processing is performed in multi-slot transmission at a fixed gain based on RSSI averaged over a plurality of time slots (for example, see Patent Document 2.)

FIG. 4 is a block diagram of reception apparatus 40 that supports conventional multi-slot transmission. In FIG. 4, reception apparatus 40 is configured with RF input section 41, automatic gain control circuit 42 that controls the gain of RF input section 41, sampling circuit 43, digital signal processor (hereinafter, referred to as "DSP") 44 and control section 45.

Sampling circuit 43 periodically samples RSSIs of a plurality of time slots received by RF input section 41 and transmits the sampled RSSIs to DSP 44. DSP 44 generates an average RSSI of each time slot included in 1 frame and transmits the result to control section 45. Control section 45 further averages the average RSSIs of all received time slots and obtains a gain value. Then, control section 45 transmits the obtained gain value to the automatic gain control circuit as an AGC signal and performs reception operation.

Patent Document 1: Japanese Patent Application Laid-Open No. 2001-211098
Patent Document 2: Japanese Patent Application Laid-Open No. 2003-46424

DISCLOSURE OF THE INVENTION

Problems to be Solved by the Invention

However, though the conventional apparatus executes offset voltage calibration in frame units, such a case where the base transceiver station executes power control is not assumed. That is, when RSSI differs between time slots in the same frame according to power control, each mobile station executes gain switching such that the signal level falls within a linear operation range of the reception apparatus, but there is a problem that offset voltage that is newly generated due to high-speed gain switching is amplified by an amplifier located in circuit later than the place where the offset voltage is generated and leads to saturation and sensitivity degradation of the reception apparatus.

Furthermore, when performing power control, the conventional apparatus needs to perform gain switching of the mobile station reception section during a guard time of approximately 30 [us] provided at the rearmost of each time slot to prevent saturation and sensitivity degradation of the reception apparatus and realize accurate demodulation. However, if offset voltage calibration is performed every time after the gain is switched to a desired value immediately before the time slot during which demodulation is performed, there is a problem that the amount of current consumption at the calibration circuit increases.

Furthermore, the conventional apparatus is not vulnerable to influences of fading or the like during multi-slot transmission and can stably receive signals of a plurality of time slots within 1 frame with the same gain setting. However, the conventional apparatus does not assume the case where power control is performed, and, if the same gain is set in 1 frame during multi-slot reception, there is a problem that the dynamic range required for the reception apparatus expands in line with the dynamic range of power control (a maximum of 30 dB in GPRS), resulting in a problem that power consumption of the reception apparatus increases or the reception apparatus is saturated.

It is therefore an object of the present invention to provide a reception apparatus and reception method capable of preventing saturation and sensitivity degradation of the reception apparatus and calibrating offset voltage without increasing current consumption when power control is performed.

Means for Solving the Problem

The reception apparatus of the present invention adopts a configuration having a gain estimation section that estimates a gain for amplifying a received signal in a predetermined reception period to a predetermined reference value for each time slot before the reception period, a gain control section that selects a maximum gain from gains for respective time slots estimated by the gain estimation section and performs gain control over the received signal and a voltage calibration section that calibrates offset voltage of the received signal before the reception period at the maximum gain selected by the gain control section.

The reception method of the present invention has steps of estimating a gain for amplifying a received signal in a predetermined reception period to a predetermined reference value for each time slot before the reception period, selecting a maximum gain from gains for respective estimated time slots and performing gain control over the received signal and calibrating offset voltage of the received signal before the reception period at the selected maximum gain.

The semiconductor integrated circuit apparatus of the present invention adopts a configuration having a gain estimation circuit that estimates a gain for amplifying a received signal in a predetermined reception period to a predetermined reference value for each time slot before the reception period, a gain control circuit that selects a maximum gain from gains for respective time slots estimated by the gain estimation circuit and performs gain control over the received signal and a voltage calibration circuit that calibrates offset voltage of the received signal before the reception period at the maximum gain selected by the gain control circuit.

ADVANTAGEOUS EFFECT OF THE INVENTION

According to the present invention, it is possible to prevent saturation and sensitivity degradation of a reception apparatus and calibrate offset voltage without increasing current consumption when power control is performed in multi-slot transmission.

BRIEF DESCRIPTION OF DRAWINGS

FIG. 1 shows an allocation of time slots for a mobile station;

FIG. 10 shows gain distribution by an analog baseband circuit according to Embodiment 1 of the present invention;

FIG. 11 shows gain distribution by the analog baseband circuit according to Embodiment 1 of the present invention;

BEST MODE FOR CARRYING OUT THE INVENTION

An essence of the present invention is to set a gain for each time slot in a predetermined reception period (1 frame) before the reception period, perform gain control of a received signal before a reception operation at the maximum gain out of the set gains, calibrate offset voltage of the received signal after the gain control at the maximum gain and before the reception operation and perform gain control of the received signal after the calibration operation of the offset voltage at a gain equal to or below the maximum gain set in each time slot during the reception operation for each time slot.

Now, embodiments of the present invention will be described in detail with reference to the accompanying drawings.

Embodiment 1

Figure 2:
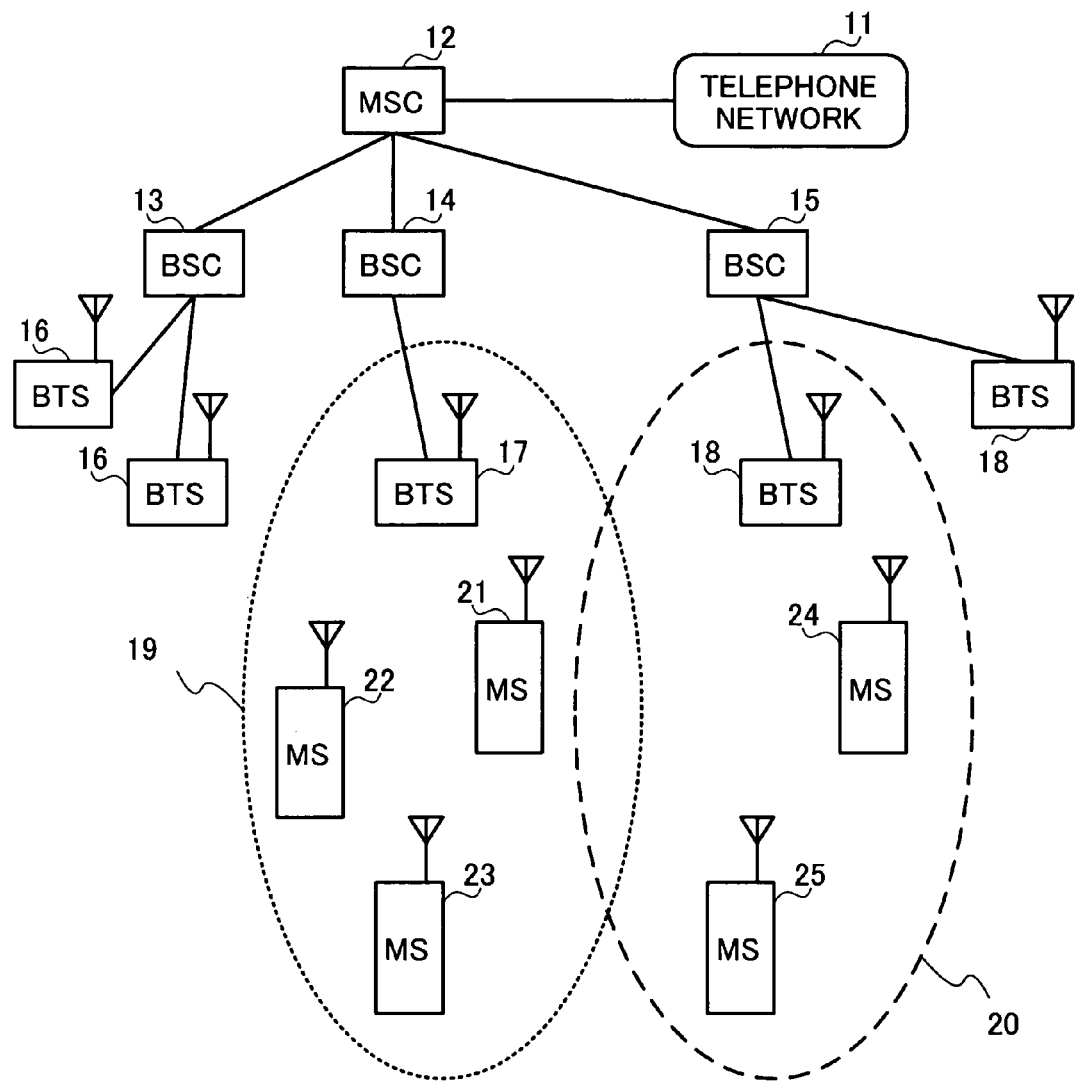
FIG. 2 shows a GSM network configuration.
Figure 3:
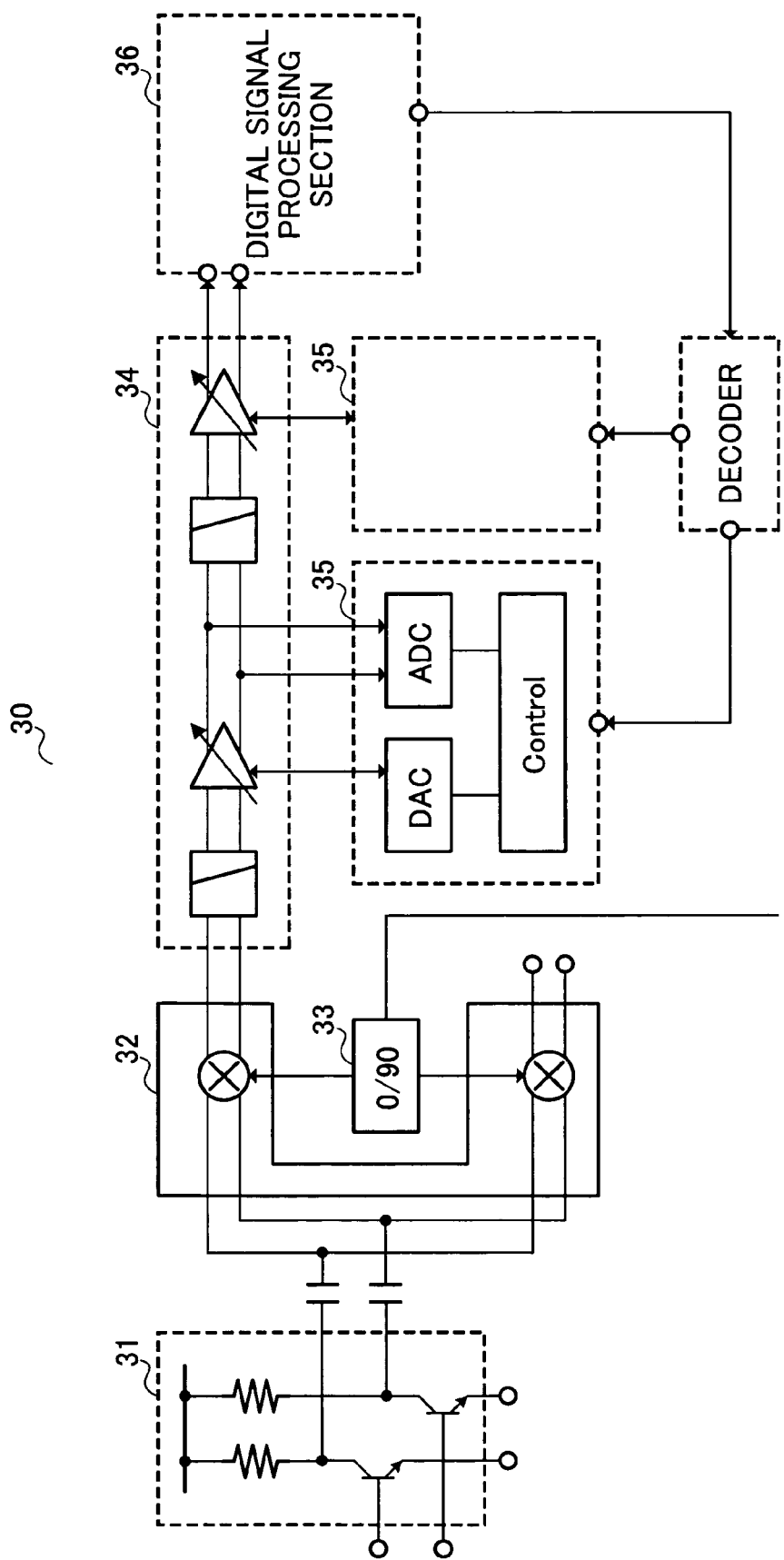
FIG. 3 is a block diagram showing a conventional offset voltage calibration circuit.
Figure 4:
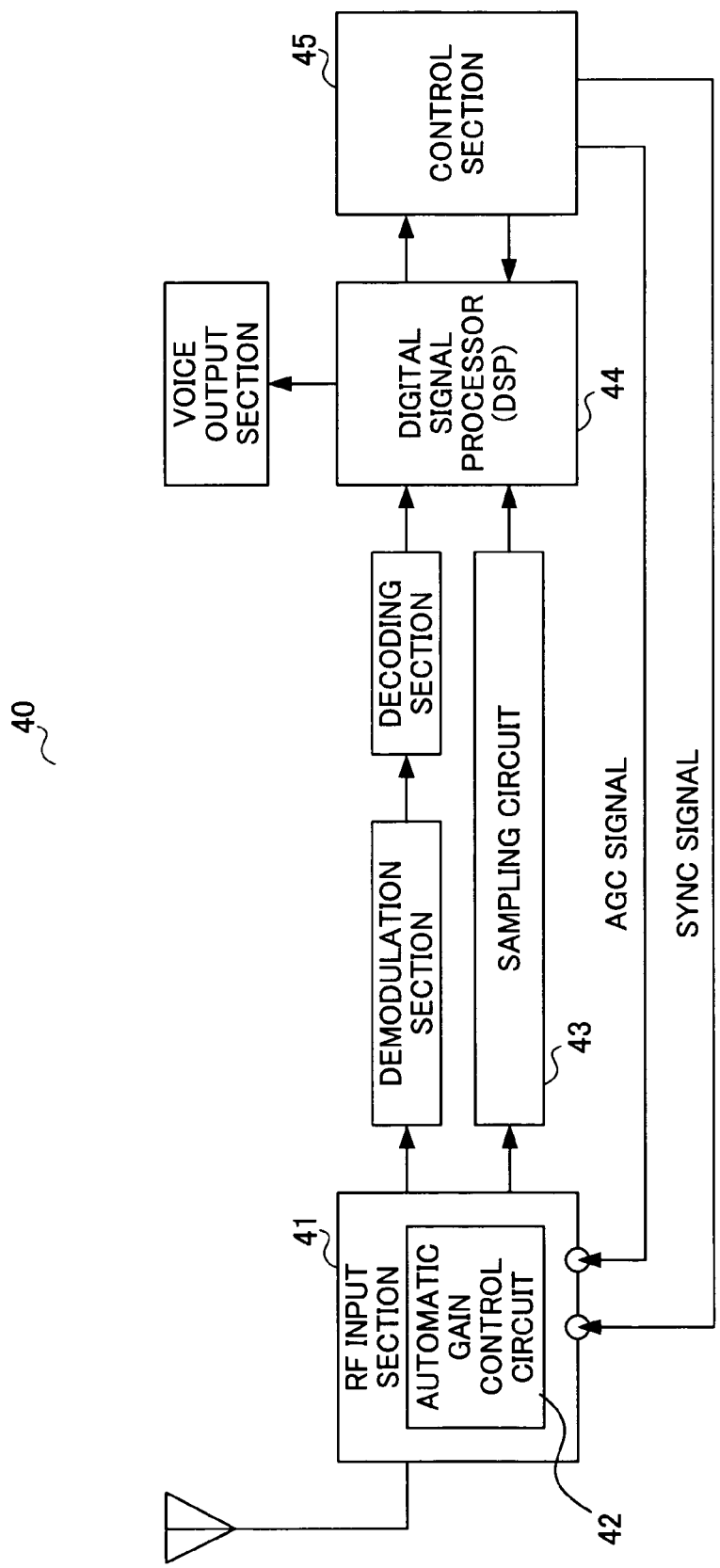
FIG. 4 is a block diagram of a reception apparatus that supports conventional multi-slot transmission.
Figure 5:
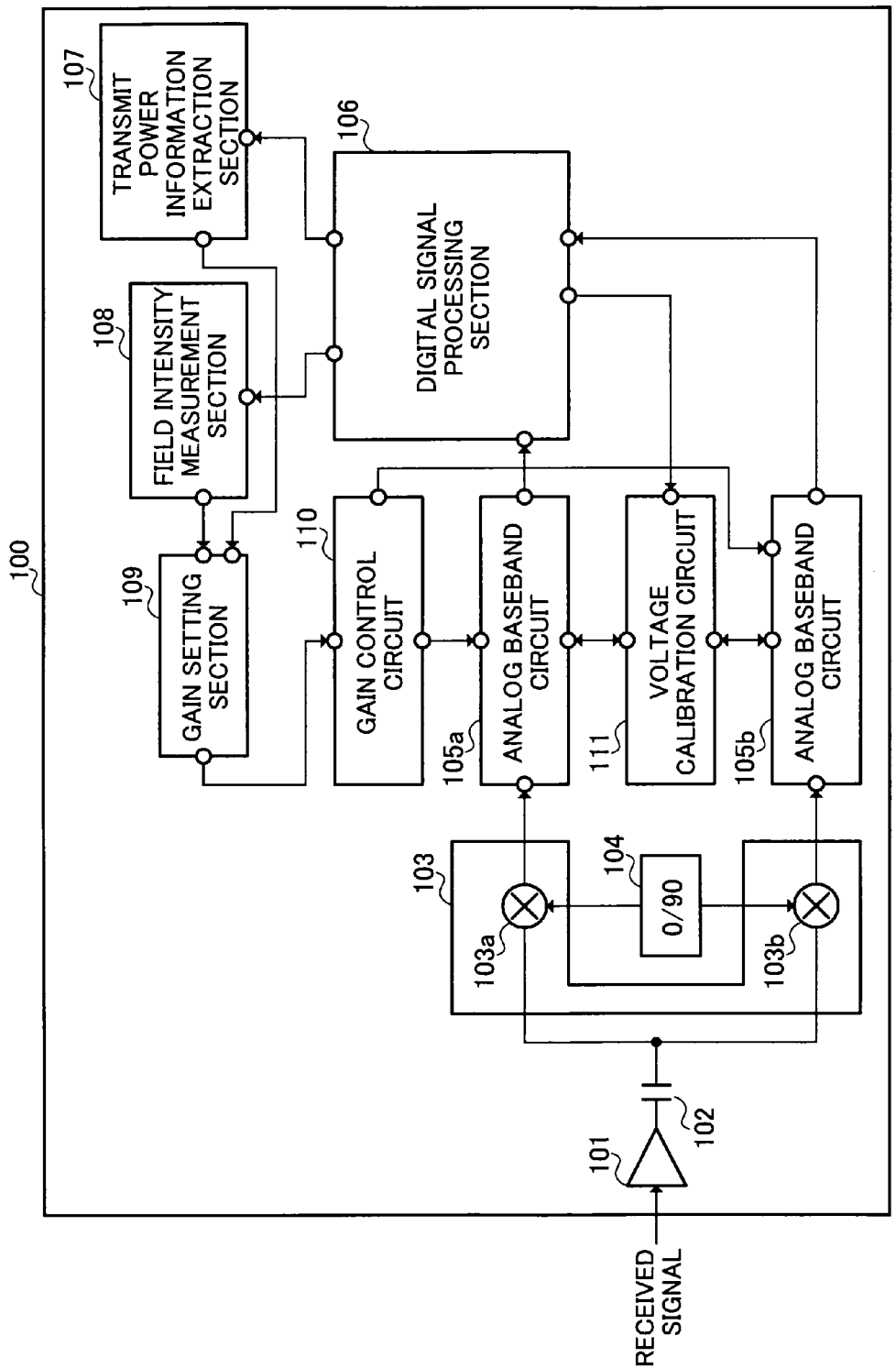
FIG. 5 is a block diagram showing the configuration of a reception apparatus according to Embodiment 1 of the present invention.

FIG. 5 is a block diagram showing the configuration of reception apparatus 100 according to Embodiment 1 of the present invention. Reception apparatus 100 according to this Embodiment 1 is a direct conversion reception apparatus.

Low noise amplifier 101 amplifies a received signal and outputs the result to quadrature demodulator 103 via capacitor 102 that removes the DC component.

Quadrature demodulator 103 has mixer 103a and mixer 103b, converts the frequency of the received signal inputted from capacitor 102 from a radio frequency to a baseband, outputs the baseband from mixer 103a to analog baseband circuit 105a and at the same time outputs the baseband from mixer 103b to analog baseband circuit 105b.

Phase shifter 104 generates two signals which have a phase difference of 90 degrees mutually from a local oscillation signal inputted from a local oscillation source (not shown) and outputs the two signals to mixer 103a and mixer 103b of quadrature demodulator 103 respectively.

Analog baseband circuits 105a, 105b are composed of a variable gain amplifier and a low pass filter and when the reception field intensity changes from a sensitivity point to an intense electric field, analog baseband circuits 105a, 105b reduce the gain of the received signal inputted from quadrature demodulator 103 one by one starting from the later circuits based on the control of gain control circuit 110 and outputs the received signal to digital signal processing section 106. In this case, analog baseband circuits 105a, 105b calibrate the offset voltage of the received signal based on the control of voltage calibration circuit 111. Analog baseband circuit 105a and analog baseband circuit 105b have the same configuration. Details of analog baseband circuits 105a, 105b will be described later.

Digital signal processing section 106 reproduces transmission data from the base transceiver station based on the received signal inputted from analog baseband circuits 105a, 105b and displays data on a display section (not shown) or outputs voice to a speaker (not shown). Furthermore, digital signal processing section 106 outputs a calibration start signal to start calibration of an offset voltage at predetermined timing to voltage calibration circuit 111. Furthermore, digital signal processing section 106 measures an RSSI from the received signal of BCCH which is transmitted from the base transceiver station or time slots for data reception and outputs the measurement result to field intensity measurement section 108. Moreover, digital signal processing section 106 outputs demodulated data to transmit power information extraction section 107.

Transmit power information extraction section 107 extracts transmit power information (e.g., P0 parameter) for each time slot from the demodulated data inputted from digital signal processing section 106 and outputs the result to gain setting section 109.

Field intensity measurement section 108 is a reception quality measurement section and reduces the influence of fading using a publicly known method from the measurement result of the RSSI inputted from digital signal processing section 106, obtains the received signal level of BCCH which becomes the control reference of base transceiver station transmit power for each time slot and outputs the obtained information of the BCCH level to gain setting section 109.

Gain setting section 109 is a gain estimation section and estimates the reception field intensity of each time slot from information of the reception field intensity of BCCH which becomes the control reference of base transceiver station transmit power for each time slot inputted from field intensity measurement section 108 and transmit power information at each time slot inputted from transmit power information extraction section 107 and calculates a gain set value according to the estimated reception field intensity. For example, gain setting section 109 sets a gain to amplify the received signal of the transmit power estimated by subtracting an incremented/decremented value of the base transceiver station transmit power acquired from the transmit power information from the reception field intensity of BCCH to the reference value for each time slot. Then, gain setting section 109 outputs gain information which is information of the gains of the respective set time slots to gain control circuit 110. At this time, gain setting section 109 sets a gain for amplifying the received signal to a predetermined reference value through a plurality of stages one by one in analog baseband circuits 105a, 105b having a multi-stage circuit configuration.

Gain control circuit 110 is a gain control section and extracts a maximum gain from the gain information inputted from gain setting section 109 and outputs the result to analog baseband circuits 105a, 105b as a set gain for a calibration operation of the offset voltage. Furthermore, gain control circuit 110 temporarily stores the gain set value which corresponds to each time slot, sequentially outputs the gain set values corresponding to the respective time slots to analog baseband circuits 105a, 105b immediately before the respective time slots and performs gain control. Furthermore, gain control circuit 110 performs gain control every stage of analog baseband circuits 105a, 105b having the multi-stage circuit configuration. The gain setting method for the calibration operation of offset voltage will be described later.

When a calibration start signal is inputted at predetermined timing from digital signal processing section 106, voltage calibration circuit 111, which is a voltage calibration section, performs calibration operation of the offset voltage produced in the received signal of analog baseband circuits 105a, 105b. In this case, voltage calibration circuit 111 calibrates the offset voltage every stage of analog baseband circuits 105a, 105b having a multi-stage circuit configuration.

Figure 6:
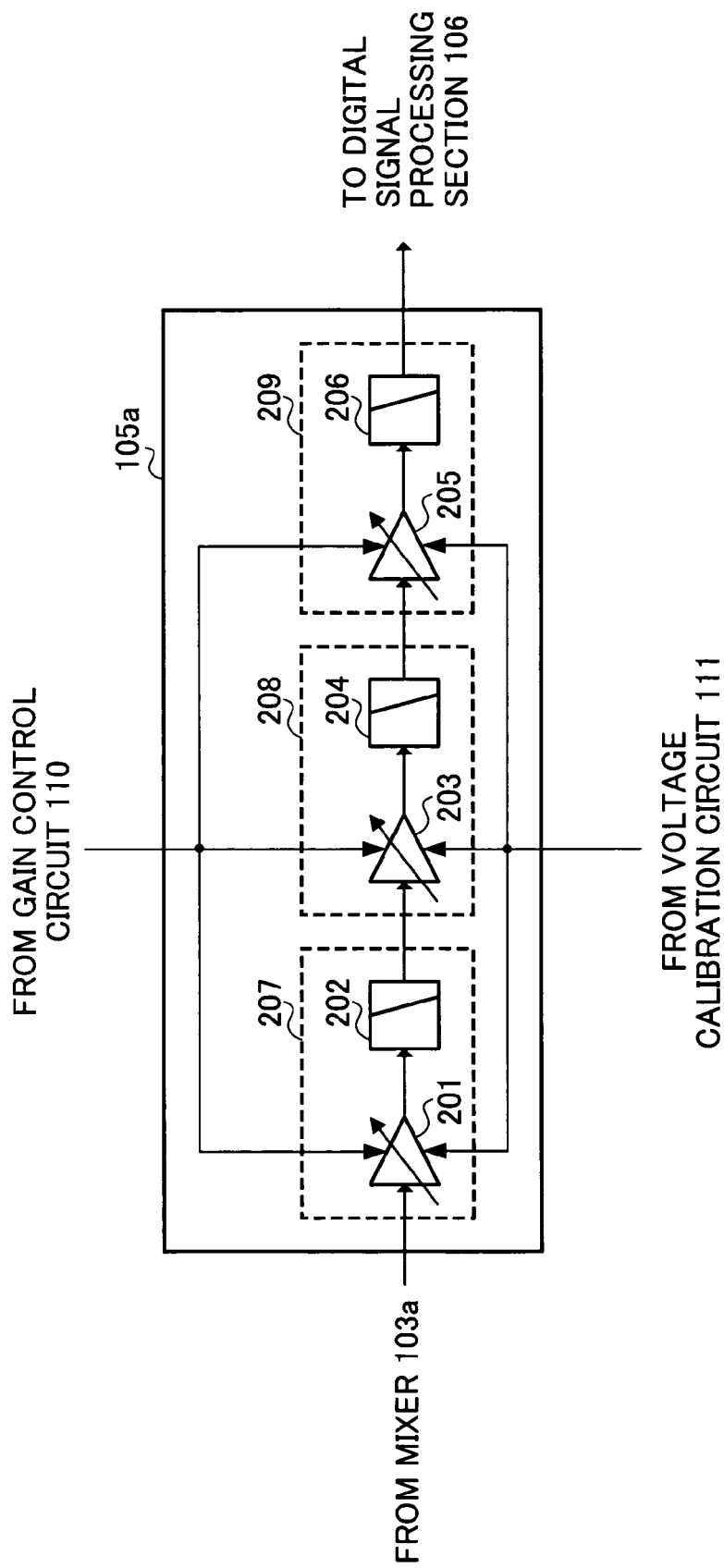
FIG. 6 illustrates a block diagram showing the configuration of an analog baseband circuit according to Embodiment 1 of the present invention.

Next, the configurations of analog baseband circuits 105a, 105b will be explained using FIG. 6. FIG. 6 is a block diagram showing the configuration of analog baseband circuit 105a. Since the configurations of analog baseband circuit 105a and analog baseband circuit 105b are the same, explanations of the configuration of analog baseband circuit 105b will be omitted.

Analog baseband circuit 105a is configured with multi-stage circuits in 3 stages; variable gain amplifier 201 and filter 202 constituting first stage circuit 207, variable gain amplifier 203 and filter 204 constituting second stage circuit 208 and variable gain amplifier 205 and filter 206 constituting third stage circuit 209. First stage circuit 207 is a circuit before second stage circuit 208 and third stage circuit 209, second stage circuit 208 is a circuit after first stage circuit 207 and before third stage circuit 209, and third stage circuit 209 is a circuit after first stage circuit 207 and second stage circuit 208.

Variable gain amplifier 201 calibrates the offset voltage of the received signal inputted from mixer 103a based on the control of voltage calibration circuit 111. Furthermore, variable gain amplifier 201 sets the received signal inputted from mixer 103a to a predetermined gain based on the control of gain control circuit 110 and outputs the result to filter 202.

Filter 202 allows only a predetermined band of the received signal inputted from variable gain amplifier 201 to pass, and outputs the result to variable gain amplifier 203.

Variable gain amplifier 203 calibrates the offset voltage of the received signal inputted from filter 202 based on the control of voltage calibration circuit 111. Furthermore, variable gain amplifier 203 sets the received signal inputted from filter 202 to a predetermined gain based on the control of gain control circuit 110 and outputs the result to filter 204.

Filter 204 allows only a predetermined band of the received signal inputted from variable gain amplifier 203 to pass, and outputs the result to variable gain amplifier 205.

Variable gain amplifier 205 calibrates the offset voltage of the received signal inputted from filter 204 based on the control of voltage calibration circuit 111. Furthermore, variable gain amplifier 205 sets the received signal inputted from filter 204 to a predetermined gain based on the control of gain control circuit 110, and outputs the result to filter 206.

Filter 206 allows only a predetermined band of the received signal inputted from variable gain amplifier 205 to pass, and outputs the result to digital signal processing section 106. In this way, analog baseband circuits 105a, 105b allow the received signal to pass through first stage circuit 207, second stage circuit 208 and third stage circuit 209, thereby eliminating unnecessary band components and amplifying the received signal so as to obtain the gain set by digital signal processing section 106.

Figure 7:
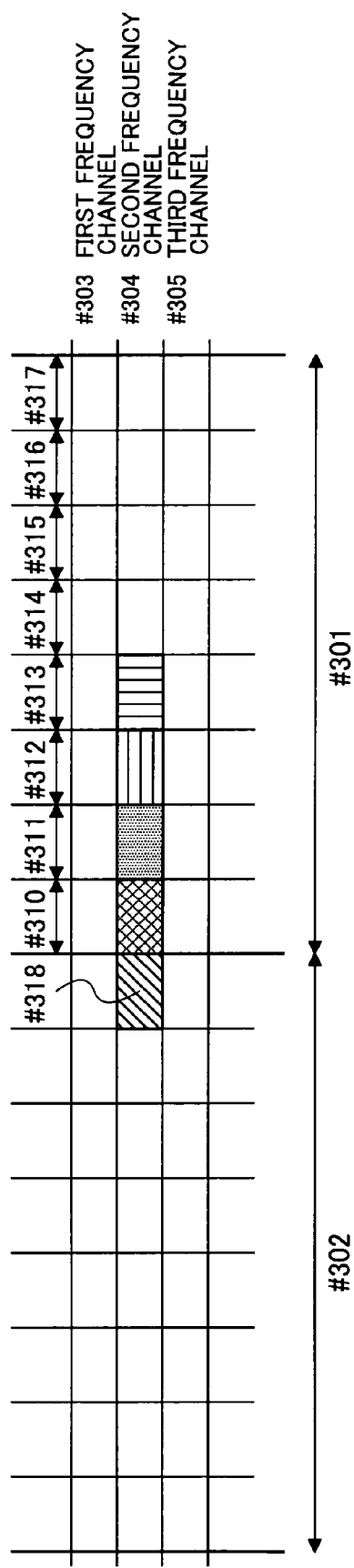
FIG. 7 shows the downlink frame configuration in GPRS according to Embodiment 1 of the present invention.

Next, the operation of reception apparatus 100 will be explained using FIG. 7 to FIG. 9. FIG. 7 shows the downlink frame configuration in GPRS in which a plurality of mobile stations share the same frequency channel, FIG. 8 shows the configuration of consecutive downlink time slots in GPRS and FIG. 9 is a schematic view showing transmit power when power control is performed in multi-slot transmission.

FIG. 7 shows the frame configurations of frame #301 and frame #302 which are predetermined reception periods. In FIG. 7, the horizontal axis is time. Furthermore, in FIG. 7, frame #301 contains downlink information for a desired mobile station and frame #302 is a frame immediately before frame #301. Furthermore, frequency channels #303, #304, #305 are channels of different downlink frequencies and time slots #310 to #317 are eight time slots which make up frame #301. On the other hand, time slot #318 is the rearmost time slot of frame #302 and a free time space which contains no effective data and which is called "guard time" is provided at the rearmost of each time slot.

Figure 8:
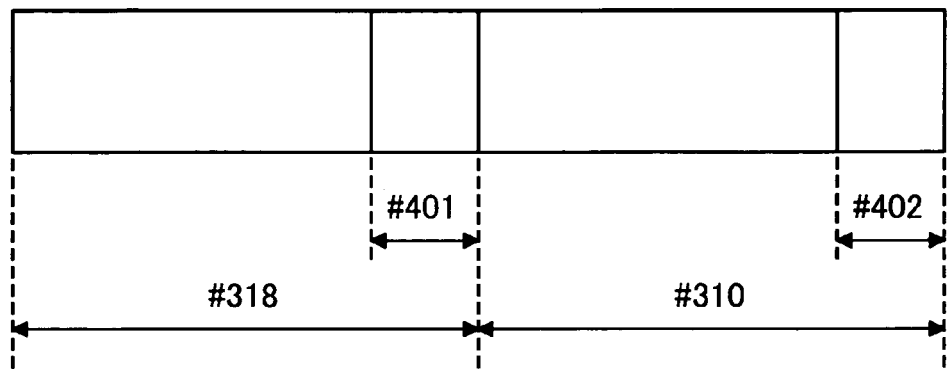
FIG. 8 shows the configuration of consecutive time slots of the downlink in GPRS according to Embodiment 1 of the present invention.

FIG. 8 shows the configurations of time slot #318 and time slot #310, where time slot #318 has guard time #401 at the rearmost and time slot #310 has guard time #402 at the rearmost. Frame #301 is received later than frame #302 and the time slots and the frames are received later in accordance with described in the right in FIG. 7 and FIG. 8.

Figure 9:
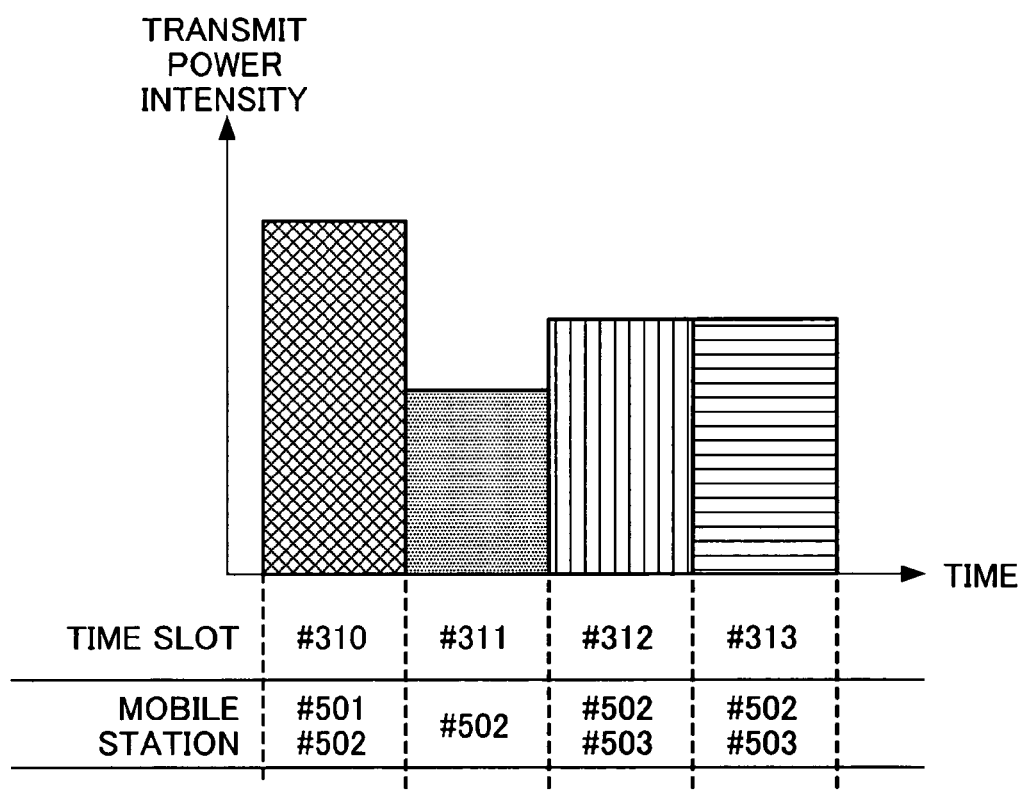
FIG. 9 is a schematic view showing transmit power control by a base transceiver station in multi-slot transmission according to Embodiment 1 of the present invention.

In FIG. 9, the horizontal axis is time and the vertical axis is transmit power intensity at the output end of the base transceiver station antenna corresponding to time slots #310, #311, #312, #313 in FIG. 7. In FIG. 9, as an example of power control in multi-slot transmission, a case is assumed where data in time slots #310, #311, #312 and #313 are transmitted to mobile stations #501, #502, #503 respectively. Here, time slot #310 is allocated to mobile station #501, time slots #310 to #313 are allocated to mobile station #502 and time slots #312, #313 are allocated to mobile station #503. Therefore, mobile stations #501, #502 receive time slot #310, mobile station #502 receives time slot #311 and mobile stations #502, #503 receive time slots #312, #313. Furthermore, the distance between the mobile station and the base transceiver station increases in the order of the mobile station to which time slot #311 is allocated, the mobile station to which time slot #312, #313 is allocated, and the mobile station to which time slot #310 is allocated. Therefore, suppose that among the time slots executing downlink transmission out of time slots #310, #311, #312, #313, #314, #315, #316, #317 of frame #301, the transmit power at time slot #310 is the largest and the transmit power at time slot #311 is the smallest.

The operation of reception apparatus 100 of mobile station #502 under the above condition will be explained. First, digital signal processing section 106 measures RSSI of BCCH transmitted from the base transceiver station communicating with reception apparatus 100 in time slots other than the downlink time slots and uplink time slot allocated to reception apparatus 100 in frame #302 or an idle frame which contains no effective data (not shown in FIG. 7.) Field intensity measurement section 108 reduces the influence of fading using a publicly known technology from the RSSI measurement value obtained before frame #301 and obtains the reception field intensity (POWbcch) of BCCH which becomes a control reference of the base transceiver station transmit power for each time slot in frame #301 and outputs the result to gain control circuit 110.

When the transmit power information of time slot #310 is P0 (#310), the transmit power information of time slot #311 is P0(#311), the transmit power information of time slot #312 is P0(#312), the transmit power information of time slot #313 is P0(#313) and P0(#312)=P0(#313) as the transmit power information of the respective time slots inputted to gain setting section 109 from transmit power information extraction section 107, gain setting section 109 performs calculations of POWbcch-P0(#310), POWbcch-P0(#311), POWbcch-P0 (#312) using POWbcch inputted from field intensity measurement section 108 as a reference. When gain switching is performed in guard time #401 immediately before each time slot in frame #301, the set gain of each corresponding time slot is obtained from the calculation result of POWbcch-P0 (#310), POWbcch-P0(#311), POWbcch-P0(#312). Furthermore, as the set gain for the calibration operation of the offset voltage carried out in guard time #401 immediately before frame #301, a maximum gain (Gmax[dB]) in frame #301 is obtained using a set gain when the P0 parameter is a maximum. For example, in guard time #401 provided at the rearmost of time slot #318 in frame #302 in FIG. 7, the P0 parameter which is the transmit power information of time slots #310 to #317 in frame #301 is compared. As a result of the comparison, since the P0 parameter which corresponds to time slot #311 is the largest, gain control circuit 110 selects the gain set value which corresponds to time slot #311 and sets it as gain information (Gmax[dB]) for the calibration operation of the offset voltage.

Then, in guard time #401, gain control circuit 110 outputs gain information (Gmax[dB]) to analog baseband circuits 105a, 105b and sets a gain for the calibration operation and after that, a calibration start signal is transmitted from digital signal processing section 106. Voltage calibration circuit 111 realizes a calibration operation in the above guard time using the calibration start signal as a trigger and then pauses in a period other than the guard time (not shown) at the rearmost of time slot #317 in frame #301. After that, in guard time #401, gain control circuit 110 outputs the gain information set to a desired value (G1[dB]) for time slot #310 to analog baseband circuits 105a, 105b and thereby sets the gain of time slot #310. Then, after the gain setting at analog baseband circuits 105a, 105b is completed, time slot #310 is received. After the reception of time slot #310 is completed, in a guard time (not shown) provided at the rearmost of time slot #310, gain control circuit 110 outputs the gain information set to a desired value (G2[dB]) for time slot #311 and sets gains of analog baseband circuits 105a, 105b. Herein after until reception of time slot #313 is completed, similar operations are repeated. In the guard time included in time slot #317 at the rearmost of frame #301, calibration operation of the offset voltage is carried out following the same procedure as that carried out immediately before frame #301. The operation during frame reception after that is the same as the operation upon the reception of frame #301 and explanations thereof will be omitted.

According to the studies in the process leading to the present invention, when the reception field intensity changes from the sensitivity point to the intense electric field like analog baseband circuits 105a, 105b of reception apparatus 100—in the case where a gain is reduced after calibration operation of the offset voltage is performed with a specific gain setting in the gain switching configuration in which a gain is reduced sequentially starting from the later circuit— the remaining offset voltage which is the offset voltage left in the received signal without being calibrated does not increase substantially. Therefore, offset voltage calibration is performed with the maximum gain setting in frame #301 in guard time #401 included in time slot #318 immediately before frame #301 of FIG. 7, and consequently it is possible to say that the remaining offset voltage does not increase substantially even if gains are switched between time slots in frame #301. The reason will be explained below.

Means for realizing variable gains of variable gain amplifiers 201, 203, 205 of analog baseband circuits 105a, 105b includes a method of switching the ratio of the resistance value at the input section or the output section of variable gain amplifiers 201, 203, 205.

When only variable gain amplifier 201 is focused, if the voltage gain of variable gain amplifier 201 is G3[dB] and offset voltage (ΔV0) occurs at the output of variable gain amplifier 201, the offset voltage of the input section of variable gain amplifier 201 is expressed as shown in Expression (1).

[Expression 1]

There is also a method of making a current (correction current) flow near the resistor of the input section of variable gain amplifier 201 from the outside at voltage calibration circuit 111 and canceling the offset voltage using voltage drop effect caused by the correction current and the input resistance.

Here, there are three methods of switching the voltage gain of variable gain amplifier 201 from G3[dB] to G4 [dB]: namely, the method of making input resistance variable, the method of making output resistance variable and the method of making both input resistance and output resistance variable.

Since the above voltage drop is calculated by multiplying the input resistance value of variable gain amplifier 201 and the correction current, the gain switching method of making input resistance variable makes the above voltage drop variable, and a remaining offset voltage of the offset voltage occurs at the input section of variable gain amplifier 201. Then, the remaining offset voltage of the input section of variable gain amplifier 201 is amplified by variable gain amplifier 201 by the gain and makes the calibration operation invalid.

On the other hand, it is preferable to use the gain switching method of making output resistance variable to prevent the occurrence of the above residual offset voltage. In this case, since the input resistance value is invariable, the above voltage drop ideally maintains a fixed value, no remaining offset occurs at the input section even if the gain is switched and "the offset voltage at the output section of variable gain amplifier 201=the offset voltage of the input section of variable gain amplifier 201×the gain of variable gain amplifier 201," the offset voltage of the output section of variable gain amplifier 201 becomes "0" even if gain switching is performed and the voltage gain becomes G4[dB]. However, even when the method of making output resistance variable is used, a voltage drop at the input resistance section of the input section of variable gain amplifier 201 may deviate from the ideal condition due to correction current temperature characteristic, and, in this case, a problem occurs which is similar to the case where the method of making input resistance variable is used. In the method of making both the input resistance and the output resistance of variable gain amplifier 201 variable, the influence of both the above method of making input resistance variable and the method of making output resistance variable appear.

Thus, as the method of preventing the calibration operation at the input section of variable gain amplifier 201 from becoming invalid due to the gain switching, there is a method of switching the gain only in the direction in which the gain is lower upon gain switching than the gain upon the calibration of the offset voltage. Since "the offset voltage at the output section of variable gain amplifier 201=the offset voltage of the input section of variable gain amplifier 201×the gain of variable gain amplifier 201," it is possible to further suppress the occurrence of offset voltage caused by gain switching as the gain after the gain switching is lower, and therefore it is effective as a method of preventing the calibration operation at the input section of variable gain amplifier 201 from becoming invalid due to gain switching. This method is of course effective for variable gain amplifiers 203, 205, too.

Next, in the case where analog baseband circuits 105a, 105b have a multi-stage circuit configuration, the method whereby the gain is switched only in the direction in which the gain is lower upon gain switching than the gain upon the calibration of the offset voltage will be explained using FIG. 6, FIG. 10 and FIG. 11. FIG. 10 and FIG. 11 show gain distribution of variable gain amplifiers 201, 203, 205 at analog baseband circuits 105a and 105b and a total gain of analog baseband circuits 105a and 105b when the gains are set. FIG. 10 and FIG. 11 show examples where the point at which the total gain is 15 [dB] is a sensitivity point and the electric field gradually becomes more intensive in accordance with the total gain approaching 0 [dB] from 15 [dB].

In case of FIG. 10, even if the gain of the received signal outputted from analog baseband circuits 105a, 105b falls below the gain upon a calibration of an offset voltage, the gains of variable gain amplifiers 201, 203, 205 of the respective stages are not necessarily switched in the direction in which the gain is reduced.

When, for example, the maximum gain required for analog baseband circuits 105a, 105b is 15 [dB] and the minimum gain is 0 [dB], if the total gain of analog baseband circuits 105a, 105b changes from 10 [dB] to 5 [dB]—that is, when transmit power information extraction section 107 estimates a maximum set gain for each frame and sets 10 [dB] as the gain for the calibration of the offset voltage and a set gain of 5 [dB] is necessary within a desired time slot—the gain of variable gain amplifier 203 is on the increase and the remaining offset voltage may expand.

On the other hand, in the case of FIG. 11, if the total gain decreases, the gains of variable gain amplifiers 201, 203, 205 are fixed or on the decrease, and it is possible to restrain the expansion of the remaining offset voltage.

When the maximum set gain of each variable gain amplifier is greater in the actual product or when a variable gain amplifier is further connected after the variable gain amplifier 205, a big problem occurs due to the remaining offset voltage of variable gain amplifier 203. Therefore, it is desirable to set a gain upon the calibration operation of the offset voltage of variable gain amplifiers 201, 203, 205 of the respective stages so that the gain is sequentially reduced from the later circuit as shown in FIG. 11.

In this way, according to this Embodiment 1, in the frame immediately before frame #301, a maximum gain in frame #301 is estimated based on the maximum value extracted from the transmit power information reported from the base transceiver station, gain control is performed upon the calibration operation of the offset voltage at the estimated maximum gain, and the set gain in the case of gain control upon the reception operation after the completion of the calibration operation of the offset voltage is made lower than the set gain in the case of gain control upon the calibration operation of the offset voltage. Therefore it is possible to minimize the influence of the remaining offset voltage in gain control in the reception operation. This makes it possible to prevent saturation and sensitivity degradation of the reception apparatus even when power control is performed in multi-slot transmission and calibrate the offset voltage without increasing current consumption. Furthermore, even when power control is performed in multi-slot transmission, accurate gain switching can be realized during the reception operation.

Furthermore, according to this Embodiment 1, since a multi-stage configuration is adopted for analog baseband circuits 105a, 105b, when the gain for the calibration operation of an offset voltage is switched to the gain for the reception operation, the gains of the respective configuration circuits of analog baseband circuits 105a, 105b decrease, and therefore it is possible to reliably restrain the amplification of the offset voltage which remains without being fully calibrated upon the calibration operation of the offset voltage. Furthermore, according to this Embodiment 1, gains are set for amplifying received signals of the same frequency in frame #301 which consists of consecutive time slots #310 to #317, and therefore it is possible to restrain the occurrence of offset voltage caused by difference in radio frequency.

For a radio system such as GPRS in which the reception frequency is not fixed and frequency hopping is performed per frame, it is effective to carry out calibration operation of offset voltage at the maximum gain for each frame as has been explained in this Embodiment 1.

Embodiment 2

Figure 12:
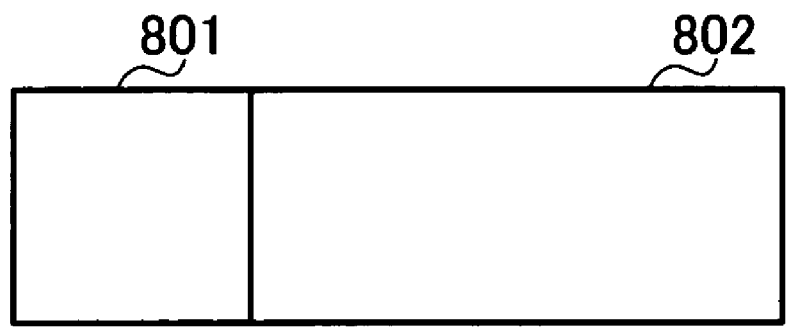
FIG. 12 shows the configuration of a time slot in GPRS according to Embodiment 2 of the present invention.

FIG. 12 shows a time slot of a received signal in GPRS received by the reception apparatus of this Embodiment 2. The reception apparatus in this Embodiment 2 has the same configuration as that in FIG. 5 and detailed explanations thereof will be omitted.

In FIG. 12, the time slot of the received signal in GPRS is composed of header field 801 and data field 802.

Next, the operation of the reception apparatus will be explained using FIG. 5 and FIG. 7. In GPRS, there is a possibility that power control may be realized using a P0 parameter in the control channel and PR parameter in header field 801 in the corresponding time slot. According to the GSM specification "Digital cellular telecommunications system (Phase 2+); Radio subsystem link control (3GPP TS 05.08 ver 8.16.0 Release 1999)", a mobile station reception apparatus is required to satisfy the GSM specification "Digital cellular telecommunications system (Phase 2+); Radio transmission and reception (3GPP TS 05.05 version 8.9.0 Release 1999)" up to a maximum of 10 [dB] in multi-slot transmission with respect to power control using PR parameter.

Therefore, when power control using PR parameter is performed in the cell where the subject mobile station exists, gain control circuit 110 estimates a maximum gain (Gmax[dB]) in frame #301 using a set gain when the P0 parameter reported from the base transceiver station before the frame is a maximum.

Moreover, gain control circuit 110 generates Gmax+10 [dB] as gain information based on set maximum gain Gmax.

But, when Gmax+10 [dB] is greater than the maximum total gain (Gtotal [dB]) of analog baseband circuits 105a, 105b, Gtotal[dB] is regarded as gain information. The rest of the operations are the same as in above Embodiment 1 and explanations thereof will be omitted.

In this way, according to this Embodiment 2, in addition to the advantage of above Embodiment 1, a maximum gain in frame #301 is estimated in frame #302 immediately before frame #301 based on the transmit power information reported from the base transceiver station and a gain higher than the estimated maximum gain by 10 [dB] is set as the gain for the calibration operation of an offset voltage. Therefore it is possible to prevent saturation and sensitivity degradation of the reception apparatus even when more efficient power control satisfying the GSM specification is performed, and perform the offset voltage calibration without increasing current consumption.

Embodiment 3

Figure 13:
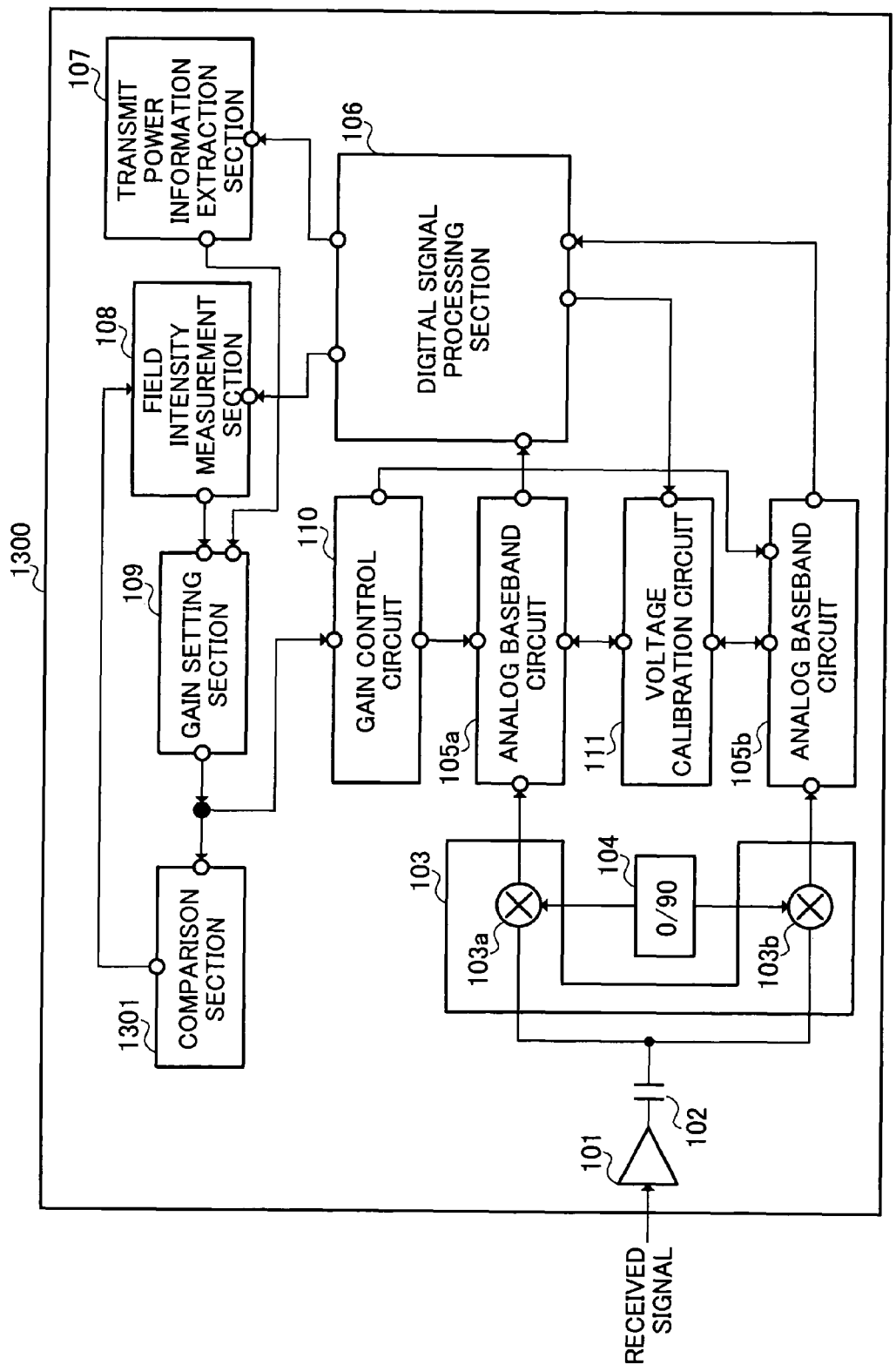
FIG. 13 is a block diagram showing the configuration of a reception apparatus according to Embodiment 3 and Embodiment 4 of the present invention.

FIG. 13 is a block diagram showing the configuration of reception apparatus 1300 according to Embodiment 3 of the present invention. Reception apparatus 1300 according to this Embodiment 3 is a direct conversion reception apparatus and adds comparison section 1301 as shown in FIG. 13 to reception apparatus 100 according to Embodiment 1 shown in FIG. 5. Parts in FIG. 13 having the same configuration as those in FIG. 5 are assigned the same reference numerals and explanations thereof will be omitted.

Field intensity measurement section 108 reduces the influence of fading from the measurement result of RSSI inputted from digital signal processing section 106 using a publicly known method, obtains the received signal level of BCCH which becomes control reference of base transceiver station transmit power for each time slot and outputs the obtained BCCH level information to gain setting section 109. Furthermore, when information of the time slot to be excluded, which is information of the time slot with a minimum gain which is not added upon calculation of BCCH level information is received from comparison section 1301, field intensity measurement section 108 does not include the RSSI upon reception of the time slot of the information of the time slot to be excluded when BCCH level information is calculated.

Gain setting section 109 estimates the reception field intensity of each time slot from the information of the reception field intensity of BCCH which becomes the control reference of base transceiver station transmit power for each time slot inputted from field intensity measurement section 108 and transmit power information at each time slot inputted from transmit power information extraction section 107 and calculates a gain set value according to the estimated reception field intensity. For example, gain setting section 109 sets a gain for amplifying the received signal of the transmit power estimated by subtracting an incremented/decremented value of the base transceiver station transmit power acquired from the transmit power information from the reception field intensity of BCCH to a reference value for each time slot. Then, gain setting section 109 outputs the gain information which is information of the set gain of each time slot to gain control circuit 110 and comparison section 1301. Time slots of the information of time slots to be excluded are excluded upon a calculation of RSSI where long-period integration is performed, but the gain of the time slot of the information of the time slot to be excluded is also set when gain of instantaneous time slots are set.

Comparison section 1301 calculates an average of gain values from gain values of gain information for each time slot in the frame inputted from gain setting section 109 and calculates an average gain value and at the same time obtains a minimum gain value out of the gain values of the gain information. Then, comparison section 1301 refers to the average gain value and the minimum gain value, and, when the difference between the average gain value and the minimum gain value is equal to or greater than a predetermined value (first threshold value), transmits information of the time slot to be excluded to field intensity measurement section 108 so that the RSSI upon the reception of the time slot with a minimum gain is not added when the BCCH level information is calculated assuming that the reception power has been incremented/decremented by power control.

When power control is performed in multi-slot transmission, it is a case where an urgent interruption occurs as described in the background art and the frequency of occurrence is generally considered low. Furthermore, the dynamic range of power control is as wide as a maximum of 30 dB, and therefore to include the RSSI during power control in calculation of gain information becomes an error factor in a gain setting. Therefore, this Embodiment 3 will show a method of excluding the RSSI during power control from the calculation of gain information.

More specifically, this embodiment assumes a case where an interruption occurs with another mobile station at a greater distance from the base transceiver station than the subject mobile station by power control. When an interruption occurs, the RSSI is larger than upon a normal reception, that is, a set gain decreases.

When the difference between the average gain value and the minimum gain value extends to a predetermined value or above based on the average gain value indicating a normal reception time, comparison section 1301 outputs the RSSI measurement timing to be excluded to field intensity measurement section 108 as information of time slots to be excluded assuming that an anticipated urgent interruption occurs here.

In this way, according to this Embodiment 3, in addition to the advantage of above Embodiment 1, it is possible to reduce errors with set gains of the reception apparatus when power control is performed upon multi-slot transmission. Furthermore, according to this Embodiment 3, the influence of extremely fluctuating RSSI is excluded when power control is performed in multi-slot transmission, and therefore it is possible to realize more accurate gain setting.

Embodiment 4

The configuration of the reception apparatus according to Embodiment 4 of the present invention is the same as the configuration in FIG. 13, and therefore this embodiment will be explained using FIG. 13.

Comparison section 1301 obtains a maximum gain value and a minimum gain value from gain values of gain information for each time slot in a frame inputted from gain setting section 109. Then, comparison section 1301 refers to the maximum gain value and the minimum gain value, and, when the difference between the maximum gain value and the minimum gain value is a predetermined value (second threshold value) or above, comparison section 1301 assumes that an increment/decrement of reception power by power control has occurred and transmits information of time slots to be excluded to field intensity measurement section 108 so that the RSSI upon reception of time slots for which the above minimum gain value has been measured is not added when BCCH level information is calculated.

This embodiment 4 will explain a method of excluding RSSI during power control from gain information calculation, which is a method different from that in Embodiment 3.

When the difference between the maximum gain value and the minimum gain value extends to a predetermined value or above, comparison section 1301 assumes that an urgent interruption explained in Embodiment 3 has occurred and outputs the RSSI measurement timing of time slots to be excluded to field intensity measurement section 108 as information of time slots to be excluded.

In this way, according to this Embodiment 4, in addition to the advantage of above Embodiment 1, it is possible to reduce errors in set gains of the reception apparatus when power control is performed in multi-slot transmission. Furthermore, according to this Embodiment 4, the influence of extremely fluctuating RSSI is excluded when power control is performed in multi-slot transmission, and therefore it is possible to realize more accurate gain setting.

In above Embodiment 1 to Embodiment 4, analog baseband circuits 105a, 105b are assumed to be constructed of multi-stage circuits having 3 stages, but the present invention is not limited to this and is applicable to multi-stage circuits having stages other than 3 stages, a circuit constructed of only one variable gain amplifier or constructed of one gain amplifier and one filter. Furthermore, Embodiment 1 to Embodiment 4 assume that a maximum set gain at each time slot of the next 1 frame is estimated in a guard time of the time slot at the rearmost of each frame, but the present invention is not limited to this, and, it is also possible to estimate a maximum set gain in a plurality of the following frames for every plurality of frames or for every plurality of time slots or estimate a maximum gain at a plurality of the following time slots. Furthermore, above Embodiment 1 to Embodiment 4 assume that a maximum gain is estimated from a maximum value of a P0 parameter in frame #302 immediately before frame #301, but the present invention is not limited to this and if transmit power information is received in frames before frame #302, it is possible to estimate a maximum gain from a maximum value of the P0 parameter in an arbitrary frame before frame #302 after receiving transmit power information.

Furthermore, reception apparatuses 100, 1300 of above Embodiment 1 to Embodiment 4 can be applied to a communication terminal apparatus. Furthermore, reception apparatuses 100, 1300 of above Embodiment 1 to Embodiment 4 can not only use gain setting section 109 as a gain setting circuit but also be constructed as a semiconductor integrated circuit apparatus which has a circuit structure (large-scale integrated circuit (LSI)) incorporating circuits such as gain setting section 109, gain control circuit 110 and voltage calibration circuit 111 as a single unit on a single semiconductor substrate.

The present application is based on Japanese Patent Application No. 2003-402232 filed on Dec. 1, 2003, entire content of which is expressly incorporated by reference herein.

INDUSTRIAL APPLICABILITY

The reception apparatus and the reception method according to the present invention can prevent saturation and sensitivity degradation of a reception apparatus even when downlink transmit power control is performed and has the advantage of calibrating offset voltage without increasing current consumption and is useful in calibrating offset voltage.

The invention claimed is:

1. A direct conversion reception apparatus for use in a system where transmit power varies between transmission signals by downlink transmit power control, the apparatus comprising:
a reception quality measurement section that measures reception quality of a first signal of an earlier received frame that is comprised of a plurality of time slots, the reception quality being measured on a per time slot basis;
a gain estimation section that estimates gains for amplifying a second signal of a later received frame, the gains being estimated on a per time slot basis, before a reception period of the later received frame, based on the reception quality of individual time slots measured by the reception quality measurement section, and the second signal being amplified to a predetermined reference value;
a gain control section that selects, on a per frame basis, a maximum gain, from the gains of individual time slots estimated by the gain estimation section, and performs gain control, on a per time slot basis, during the reception period of the later received frame; and
a voltage calibration section that calibrates an offset voltage of the second signal of the later received frame, on a per frame basis, before the reception period of the later received frame, using a calibration value matching the maximum gain selected by the gain control section.

2. The reception apparatus according to claim 1, wherein:
the reception quality measurement section determines a reception field intensity as a control reference in transmit power control for time slots, from the reception quality of individual time slots; and
the gain estimation section estimates the reception field intensities of individual time slots of the later received frame, from the reception field intensity and transmit power information of individual time slots of the earlier received frame, the transmit power information being included in demodulated data of the earlier received frame, and the gain estimation section further estimates the gains of individual time slots according to the reception field intensities of the time slots of the later received frame.

3. The reception apparatus according to claim 1, wherein, when a difference between an average gain of the gains of individual time slots in a reception period of the earlier received frame, and a minimum gain among the gains of individual time slots in the reception period of the earlier received frame, is equal to or greater than a threshold, the gain estimation section estimates the gains of individual time slots of the later received frame, by excluding a measurement value of the time slot of the minimum gain.

4. The reception apparatus according to claim 1, wherein, when a difference between a maximum gain among the gains of individual time slots in a reception period of the earlier received frame, and a minimum gain among the gains of individual time slots in the reception period of the earlier received frame, is equal to or greater than a threshold, the gain estimation section estimates the gains of individual time slots of the later received frame, by excluding a measurement value of the time slot of the minimum gain.

5. The reception apparatus according to claim 2, wherein the gain estimation section subtracts increment and decrement values of transmit power indicated in the transmit power information from the reception field intensity on a per time slot basis and estimates transmit powers of individual time slots, and estimates the gains of individual time slots for amplifying a received signal of an estimated transmit power to the predetermined reference value.

6. The reception apparatus according to claim 2, wherein:
the gain estimation section sequentially sets the gains for amplifying a received signal to the predetermined reference value through a plurality of stages, in the reception period of the later received frame, on a per stage basis, such that a gain in an earlier stage in the plurality of stages is equal to or greater than a gain in a later stage; and
the gain control section performs gain control of the received signal on a per stage basis in the reception period of the later received frame, using the gains of individual stages set by the gain estimation section.

7. A direct conversion reception method for use in a system where transmit power varies between transmission signals by downlink transmit power control, the method comprising:
measuring reception quality of a first signal of an earlier received frame that is comprised of a plurality of time slots, the reception quality being measured on a per time slot basis;
estimating gains for amplifying a second signal of a later received frame, the gains being estimated on a per time slot basis, before a reception period of the later received frame, based on the measured reception quality of individual time slots, and the second signal being amplified to a predetermined reference value;
selecting, on a per frame basis, a maximum gain, from the estimated gains of individual time slots;
performing gain control, on a per time slot basis, during the reception period of the later received frame; and
calibrating an offset voltage of the second signal of the later received frame, on a per frame basis, before the reception period of the later received frame, using a calibration value matching the selected maximum gain.

8. The direct conversion reception method according to claim 7, further comprising:
determining a reception field intensity as a control reference in transmit power control for time slots, from the reception quality of individual time slots; and
estimating the reception field intensities of individual time slots of the later received frame, from the reception field intensity and transmit power information of individual time slots of the earlier received frame, the transmit power information being included in demodulated data of the earlier received frame, wherein
the gains of individual time slots are estimated according to the reception field intensities of the time slots of the later received frame.

9. A semiconductor integrated circuit apparatus in a direct conversion reception apparatus for use in a system where transmit power varies between transmission signals by downlink transmit power control, the semiconductor integrated circuit apparatus comprising:
a reception quality measurement circuit that measures reception quality of a first signal of an earlier received frame that is comprised of a plurality of time slots, the reception quality being measured on a per time slot basis;
a gain estimation circuit that estimates gains for amplifying a second signal of a later received frame, the gains being estimated on a per time slot basis, before a reception period of the later received frame, based on the reception quality of individual time slots measured by the reception quality measurement circuit, and the second signal being amplified to a predetermined reference value;
a gain control circuit that selects, on a per frame basis, a maximum gain, from the gains of individual time slots estimated by the gain estimation circuit, and performs gain control, on a per time slot basis, during the reception period of the later received frame; and
a voltage calibration circuit that calibrates an offset voltage of the second signal of the later received frame, on a per frame basis, before the reception period of the later received frame, using a calibration value matching the maximum gain selected by the gain control circuit.

10. The semiconductor integrated circuit apparatus according to claim 9, wherein:
the reception quality measurement circuit determines a reception field intensity as a control reference in transmit power control for time slots, from the reception quality of individual time slots; and
the gain estimation circuit estimates the reception field intensities of individual time slots of the later received frame, from the reception field intensity and transmit power information of individual time slots of the earlier received frame, the transmit power information being included in demodulated data of the earlier received frame, and the gain estimation circuit further estimates the gains of individual time slots according to the reception field intensities of the time slots of the later received frame.

\* \* \* \* \*